(12) United States Patent
Potok et al.

(10) Patent No.: US 7,884,633 B2
(45) Date of Patent: Feb. 8, 2011

(54) WIDE AREA SOFT DEFECT LOCALIZATION

(75) Inventors: Ronald M. Potok, Austin, TX (US); Rama R. Goruganthu, Austin, TX (US); David E. Kloster, Austin, TX (US); Norman E. Rhodes, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 239 days.

(21) Appl. No.: 12/133,305

(22) Filed: Jun. 4, 2008

(65) Prior Publication Data
US 2009/0302880 A1   Dec. 10, 2009

(51) Int. Cl.
G01R 31/26    (2006.01)
(52) U.S. Cl. ..................... 324/765; 324/751; 324/752
(58) Field of Classification Search .................. None
See application file for complete search history.

(56) References Cited

U.S. PATENT DOCUMENTS 5,065,008 A * 11/1991 Hakamata et al. ........... 250/216
5,192,913 A    3/1993 Goruganthu et al.
6,744,268 B2 * 6/2004 Hollman ..................... 324/758
7,459,686 B2 * 12/2008 Syllaios et al. ........... 250/338.1

OTHER PUBLICATIONS

Daniel J. Burns et al.; *Reliability/Design Assessment by Internal-Node Timing-Margin Analysis Using Laser Photocurrent-Injection*; CH1990-1/84/0000-0076;1984 IEEE/IRPS; pp. 76-82.
Michael R. Bruce et al.; *Soft Defect Localization (SDL) in Integrated Circuits using Laser Scanning Microscopy*; 0-7803-7888-1/03; 2003 IEEE; pp. 662-663.
Jeremy A. Rowlette et al.; *Critical Timing Analysis in Microprocessors Using Near-IR Laser Assisted Device Alteration (LADA)*; ITC International Test Conference; 0-7803-8106-8/03; 2003 IEEE; pp. 264-273.

* cited by examiner

Primary Examiner—Minh N Tang
(74) Attorney, Agent, or Firm—Timothy M. Honeycutt

(57) ABSTRACT

Various apparatus and methods of testing a semiconductor chip for soft defects are disclosed. In one aspect, a method of testing a semiconductor chip that has a surface and plural circuit structures positioned beneath the surface is provided. An external stimulus is applied to a series of fractional portions of the surface to perturb portions of the plural circuit structures such that at least one of the series of fractional portions is smaller than another of the series of fractional portions. The semiconductor chip is caused to perform a test pattern during the application of external stimulus to each of the fractional portions to determine if a soft defect exists in any of the series of fractional portions.

22 Claims, 6 Drawing Sheets

WIDE AREA SOFT DEFECT LOCALIZATION

BACKGROUND OF THE INVENTION

1. Field of the Invention

This invention relates generally to semiconductor processing, and more particularly to methods and apparatus for testing semiconductor chips.

2. Description of the Related Art

Soft defect isolation techniques are critical to the development and manufacture of large-scale integrated circuits such as processors. Examples of such techniques include those methodologies which exploit induced voltage alterations, such as Thermally Induced Voltage Alteration ("TIVA"), Light Induced Voltage Alteration ("LIVA") and Charge Induced Voltage Alteration ("CIVA"). The basic setup for these techniques uses a constant current source for biasing the device under test ("DUT") and a detector to sense the change in the voltage demand due to the localized heating, light stimulation by the laser or charge stimulation by an e-beam.

Another soft defect testing variant uses a scanning laser microscope to scan over the entire surface of a die on a pixel-by-pixel basis. While the laser spot dwells on a given pixel, a test computer causes the die to execute a test pattern or script. The laser radiation causes a local perturbation to the circuit. If a soft defect coincides with the location of the laser spot, then the test pattern will register an anomaly and the pixel location on the die in question will be flagged for further fault analysis.

Testing time is a limitation associated with the pixel-by-pixel approach. The test pattern must be run at least once for each pixel. The number of pixels that must be scanned individually for a given die will depend on the die size and the field of view of the laser microscope. A typical field of view is 512×512 pixels at a 5× magnification. Under such conditions, a 1 cm×1 cm die will require the field of view to be moved twenty-five times to fully cover the die. Even though current test patterns require perhaps a few microseconds to a few milliseconds to run, the time for each test pattern multiplied by the shear number of pixels can lead to hours or even days of testing time to locate just one soft defect. Care must also be taken to account for the potential for the scanning technique to produce a discontinuity between the length of time that the incident radiation beam strikes a given pixel and the response time of the signal detection circuitry. If the illumination time per pixel is less than the response time of the signal detection circuitry, then the sensed signal will tend to smear into adjacent pixels and produce a characteristic tail pattern that can obscure the behavior of adjacent structures.

One conventional technique to address the issue of testing time involves test pattern construction. Long and complex test patterns have the benefit of more fully exercising the circuits of the die and thus revealing more types of soft defects, particularly those that present very subtle characteristics. However, as a time saver, conventional test patterns are deliberately written to be relatively short, which limits the number and complexity of critical timing paths or soft defects that may be analyzed.

The present invention is directed to overcoming or reducing the effects of one or more of the foregoing disadvantages.

SUMMARY OF THE INVENTION

In accordance with one aspect of the present invention, a method of testing a semiconductor chip that has a surface and plural circuit structures positioned beneath the surface is provided. An external stimulus is applied to a series of fractional portions of the surface to perturb portions of the plural circuit structures such that at least one of the series of fractional portions is smaller than another of the series of fractional portions. The semiconductor chip is caused to perform a test pattern during the application of external stimulus to each of the fractional portions to determine if a soft defect exists in any of the series of fractional portions.

In accordance with another aspect of the present invention, a method of testing a semiconductor chip is provided that includes covering a first portion of the semiconductor chip while leaving a second portion exposed and applying an external stimulus to the second portion of the semiconductor chip. The semiconductor chip is caused to perform a test pattern during the application of the external stimulus to determine if a soft defect exists in the second portion of the semiconductor chip.

In accordance with another aspect of the present invention, an apparatus for testing a semiconductor chip that has a surface and plural circuit structures positioned beneath the surface is provided. A source of external stimulus is operable to stimulate a series of fractional portions of the surface to perturb portions of the plural circuit structures such that at least one of the series of fractional portions is smaller than another of the series of fractional portions. A computer system is electrically coupled to the semiconductor chip to cause the semiconductor chip to perform a test pattern during the application of external stimulus to each of the fractional portions to determine if a soft defect exists in any of the series of fractional portions.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
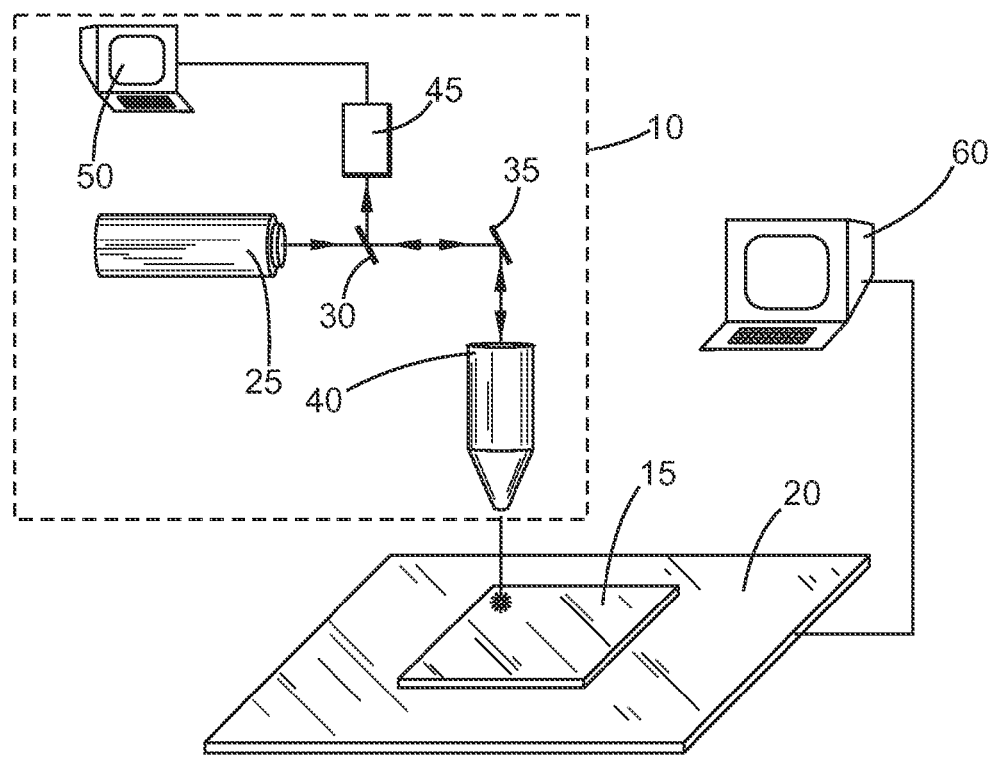
FIG. 1 is a pictorial view of an exemplary conventional laser scanning microscopy system.

In the drawings described below, reference numerals are generally repeated where identical elements appear in more than one figure. Before discussing the exemplary embodiments disclosed herein, it will be instructive to review briefly the structure and function of a conventional laser scanning/stimulation microscopy system. Turning now to the drawings, and in particular to FIG. 1, therein is shown a pictorial view of an exemplary conventional laser scanning microscopy system 10 (hereinafter laser system 10) that is configured to permit the laser scanning and stimulation of a semiconductor chip 15 mounted on a package substrate 20. The laser system 10 includes an infrared wavelength laser 25, a beam splitter 30, a movable positioning mirror 35, an objective lens 40, a photo detector 45 and a computer system 50. Infrared laser radiation 55 delivered from the laser 25 passes through the beam splitter 30 and is reflected through the objective lens 40 by way of the positioning mirror 35. The laser radiation 55 leaving the objective lens 40 is focused at selected positions on the semiconductor chip 15 for purposes of causing a local perturbation in the circuit structures of the semiconductor chip 15. The semiconductor chip 15 is electrically connected to a computer system or test system 60 that is operable to run certain electrical tests or patterns in the semiconductor chip 15 while the laser radiation 55 is focused on a particular spot of the chip 15. Infrared wavelengths are selected for this type of testing due to their ability to penetrate silicon. Even so, the chip 15 must usually be thinned or deprocessed prior to testing to remove various layers of oxide, passivation and other materials that are commonly applied to semiconductor chips and which could prevent the laser radiation from penetrating sufficiently to reach circuit structures.

The laser system 10 is not only operable to deliver laser radiation 55 to the semiconductor chip 15 for the purposes of circuit stimulation but also for the purposes of laser microscopy. Thus, laser radiation 55 reflects upward through the lens 40 and off the positioning mirror 35 to the back side of the beam splitter 30 and eventually into the photo detector 45, which produces output signals that are converted into an image in the computer system 50. The chip 15 and substrate 20 may be seated on a two-axis moveable stage (not shown).

Figure 2:
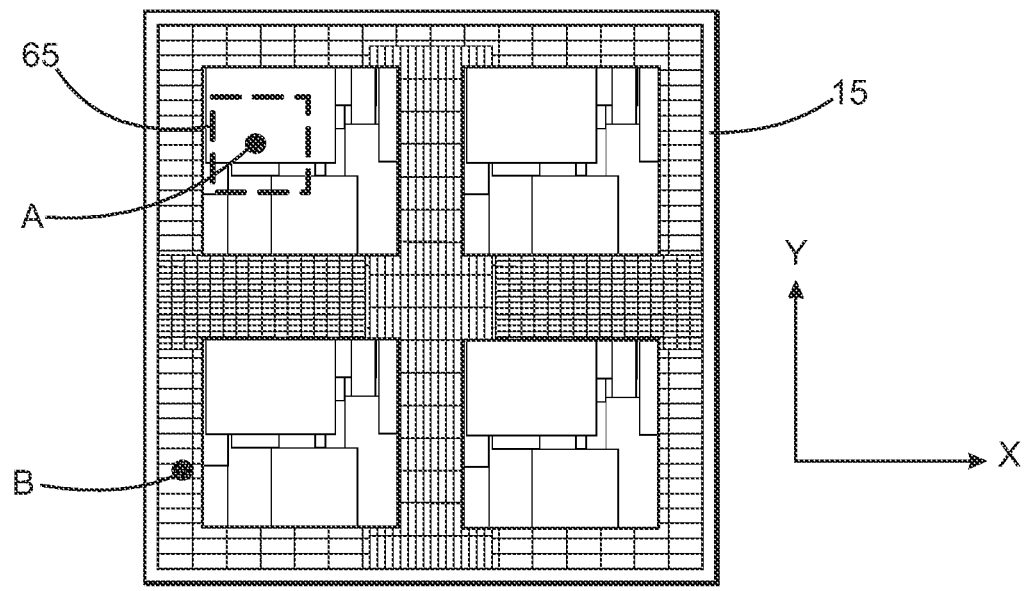
FIG. 2 is an overhead view of a semiconductor chip undergoing examination by the microscopy system depicted in FIG. 1.
Figure 3:
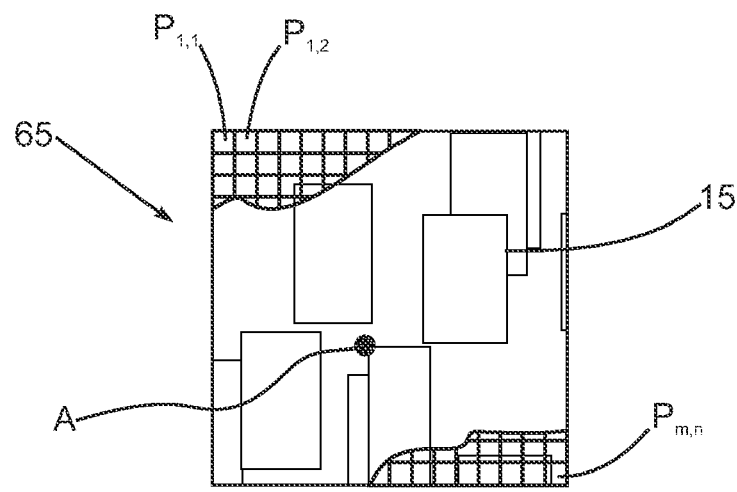
FIG. 3 is a magnified overhead view of a portion of the semiconductor chip.

To understand a conventional laser scanning defect technique, it will be useful to refer now also to FIG. 2, which is an overhead view of just the chip 15. The lens 40 depicted in FIG. 1 has a field of view that is represented by the dashed box 65 on the chip 15 in FIG. 2. The field of view 65 will have a physical size that is dependent upon the magnification level of the lens 40 depicted in FIG. 1 though usually smaller than the size of the chip 15. A higher magnification lens 40 will produce a smaller field of view 65. The locations of two hypothetical soft defects in the semiconductor chip 15 are labeled A and B, respectively. The hypothetical soft defect A is fortuitously located with the illustrated position of the field of view 65 of the lens 40. The soft defect B is not. To scan the chip 15 for soft defects, either the chip 15 or the lens 40 is moved to a certain position in the X-Y plane so that the field of view 65 corresponds to a selected location of the chip 15, such as the location of the field of view in FIG. 2. The portion of the chip 15 covered by the field of view 65 is shown at greater magnification in FIG. 3. The field of view 65 is subdivided into an array of some number of pixels $P_{1,1}, P_{1,2} \ldots P_{m,n}$. Note that most of the pixels $P_{1,1}, P_{1,2} \ldots P_{m,n}$ are shown cut away so that the location of the soft defect A is visible. One typical conventional field of view is subdivided into an array of 512×512 pixels. The laser 25 is sequentially activated at each of the pixels $P_{1,1}, P_{1,2} \ldots P_{m,n}$. During illumination at each given pixel, one or more test patterns or scripts are run by the computer system 60 to cause the chip 15 to perform various functions, such as floating point calculations, matrix manipulations, etc. The duration of typical conventional test patterns are normally on the order of a few microseconds to a few milliseconds. The laser radiation causes a perturbation in the chip circuitry at each pixel. If a soft defect, like the defect A, is encountered, a computational error will usually be detected by the computer system 60 and the offending pixel will be flagged. The chip 15 will then be subjected to a further testing to identify the source of the soft defect, e.g., process defect, design rule violation etc.

As noted in the Background section hereof, conventional laser soft defect scanning can take hours or days. Examination of each of the pixels $P_{1,1}, P_{1,2} \ldots P_{m,n}$ within the array will require: (1) a small movement of either the chip 15 in the X-Y plane, or perhaps a movement of the laser radiation beam 55 if that is possible with the laser system 10 to each pixel; (2) the activation of the laser 25; and (3) the execution of the test pattern(s), and so on for the remainder of the chip 15. The sheer number of individual pixels that must be examined and the steps that must be taken for each pixel simply take time. If the soft defects A and B on the chip 15 happen to be positioned remotely from where the field of view 65 of the lens 40 is positioned during the initial phases of the test, significant time may be consumed before the positions of the defects A and B are located.

The conventional system 10 uses a fixed field of view and a fixed pixel array to test very small portions of the chip 15 one pixel at a time. The new wide area soft defect localization systems and techniques disclosed herein take a different approach. Instead of focusing on one pixel at a time, much larger fractional portions of a chip are subjected to perturbation and test patterning in order to quickly identify the location of a soft defect, say in one half fractional portion or one quadrant fractional portion of a chip. More focused testing can then be concentrated on the offending chip block. As a result, more time consuming pixel-by-pixel testing can be limited to smaller portions of a chip that have been previously identified as containing a soft defect.

Figure 4:
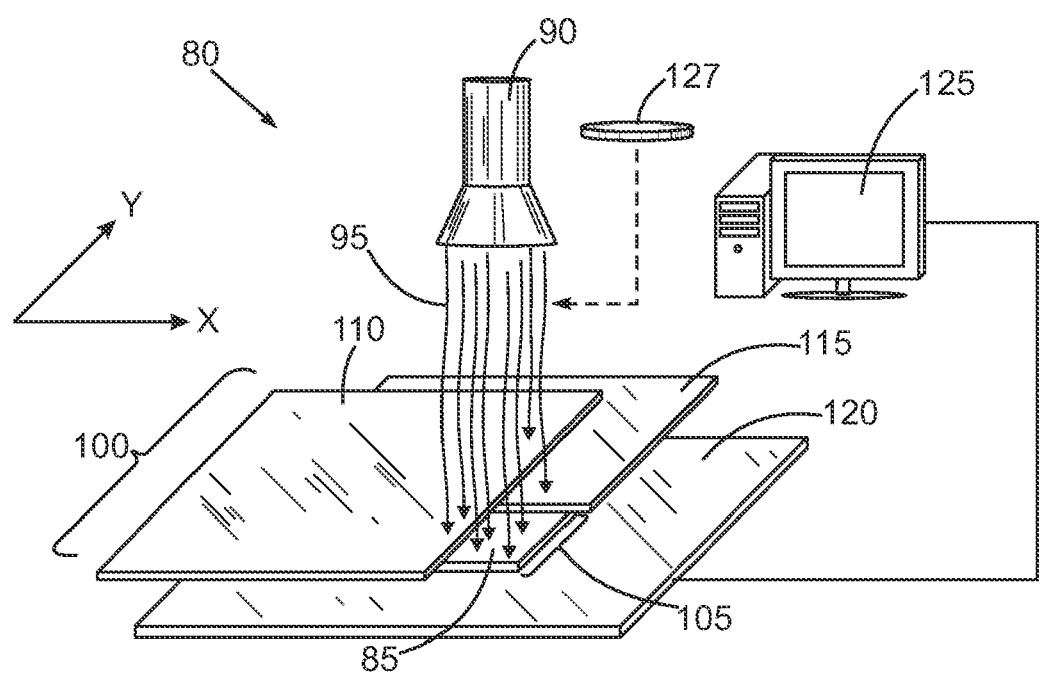
FIG. 4 is a pictorial view of an exemplary embodiment of a defect scanning system that is operable to detect soft defects in a semiconductor chip.

With that backdrop, attention is now turned to FIG. 4, which is a pictorial view of an exemplary embodiment of a defect scanning system 80 that is operable to enable relatively rapid detection of soft defects in a semiconductor chip 85. The system 80 includes a stimulation source 90 that may be an infrared lamp, a laser in the 1.0 to 12.0 micron wavelength range, or other range, or some other stimulation source. In this illustrative embodiment, the stimulation source 90 may be an infrared lamp that is capable of projecting infrared radiation 95 toward the semiconductor chip 85. The lamp 90 may, but need not produce coherent radiation, and should be capable of delivering about 2.0 W/cm$^2$ of power. At this power level, a 5 to 10° C. localized temperature increase may be created in the chip 85. A shutter system 100 is interposed between the lamp 90 and the semiconductor chip 85 to selectively cover various portions of the semiconductor chip 85. For example, in FIG. 4, the shutter system 100 is set to obscure all but a corner portion 105 of the semiconductor chip 85. The shutter system 100 may consist of one or more shutter plates, two of which are depicted and labeled 110 and 115 respectively. The shutter plates 110 and 115 may be located in different vertical positions as shown and each may be operable along one or more axes, such as the X and Y-axes depicted in FIG. 4. The shutter plates 110 and 115 may be fabricated from a variety of materials, such as metals, plastics, ceramics or others.

The semiconductor chip 85 may be coupled to a semiconductor chip package 120 that is connected to a computer system 125 capable of electrically stimulating the semiconductor chip 85 by way of a plurality of test patterns or scripts that are run when selected portions, such as the portion 105, of the chip 85 are exposed to the radiation 95. The test patterns may exercise any aspects of the chip 85, such as floating point calculations, memory management, input output functions, analog processing and power management to name just a few. The computer system 125 may be a general purpose computer or a computing device specifically tailored for test pattern execution, and should include one or more processors distinct from the semiconductor chip 85. Optionally, an optics system 127 may be placed in the pathway of the lamp 90 and may include one or more lenses and/or filters to alter the characteristics of the radiation 95.

Figure 5:
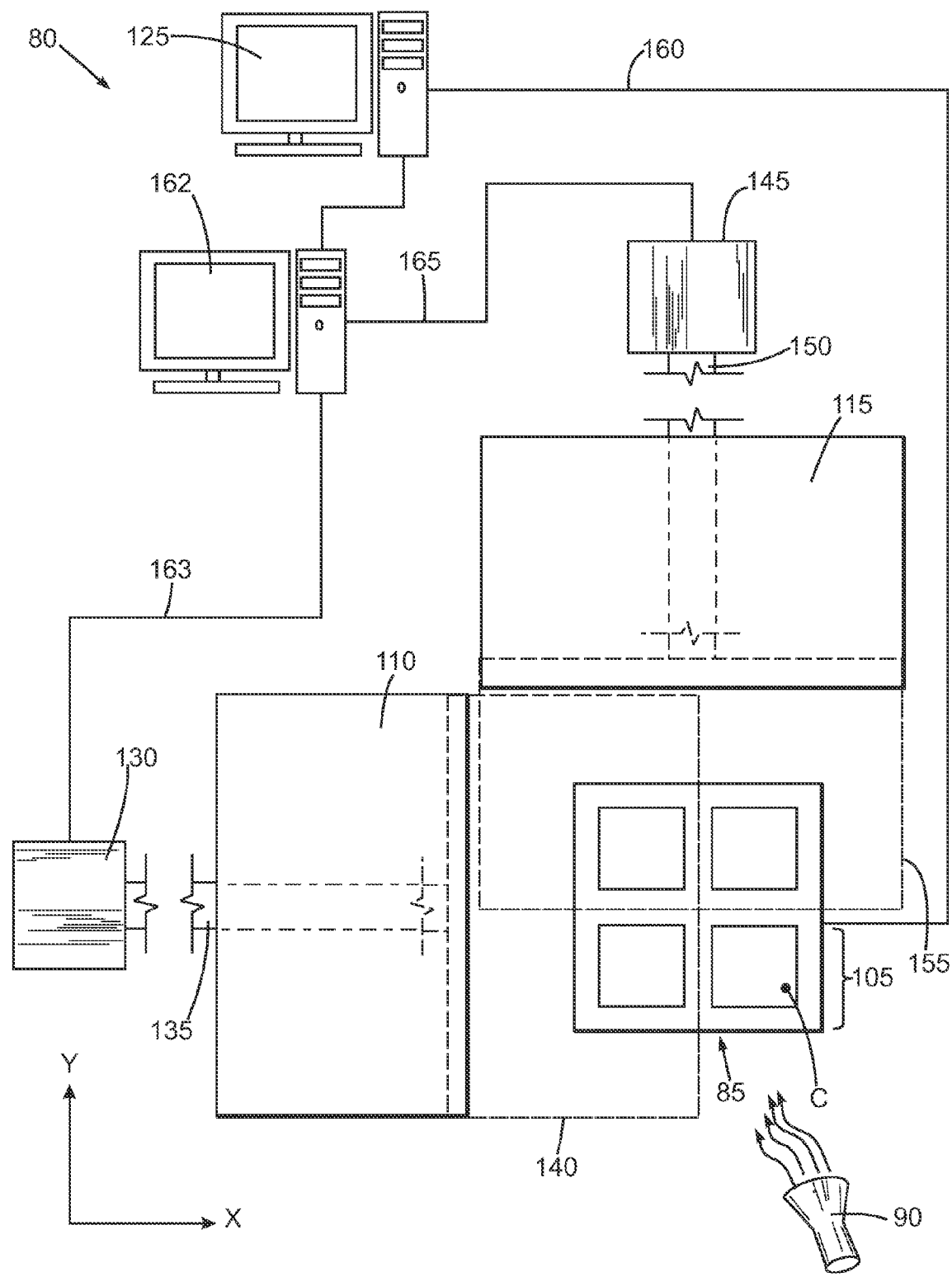
FIG. 5 is an overhead view showing a semiconductor chip and the exemplary embodiment of a defect scanning system.

Additional details of the system 80 may be understood by referring now also to FIG. 5, which is an overhead view showing the semiconductor chip 85 without the package substrate 120 depicted in FIG. 4, as well as the computer system 125, the two shutter plates 110 and 115 of the shutter system 100 and the lamp 90. The shutter plate 110 may be connected to an actuator 130 capable of two-axis movement by way of a shaft 135 or other member. The shaft 135 may be of such length that it is appropriate to show it broken. The shutter plate 110 is thus movable from the position shown to multiple positions, such as the extended position along the X-axis represented by the dashed box 140. The shutter plate 115 is similarly coupled to an actuator 145 also capable of two-axis movement by way of a shaft or member 150 that is again shown broken. Like the shutter plate 110, the shutter plate 115 is movable over the semiconductor chip 85 as indicated by the dashed box 155. As noted above, the semiconductor chip 85 may be electrically connected to the computer system 125 by way of a line 160. If desired, a second computer system 162 may be provided to control the movements of the actuators 130 and 145 by way of respective control lines 163 and 165, and may be tied to the other computer system 125. Optionally, the functions of the computer systems 125 and 162 may be combined into a single system. For purposes of this illustration, it is assumed that a soft defect C exists in the portion 105 of the semiconductor chip 85.

Figure 6:
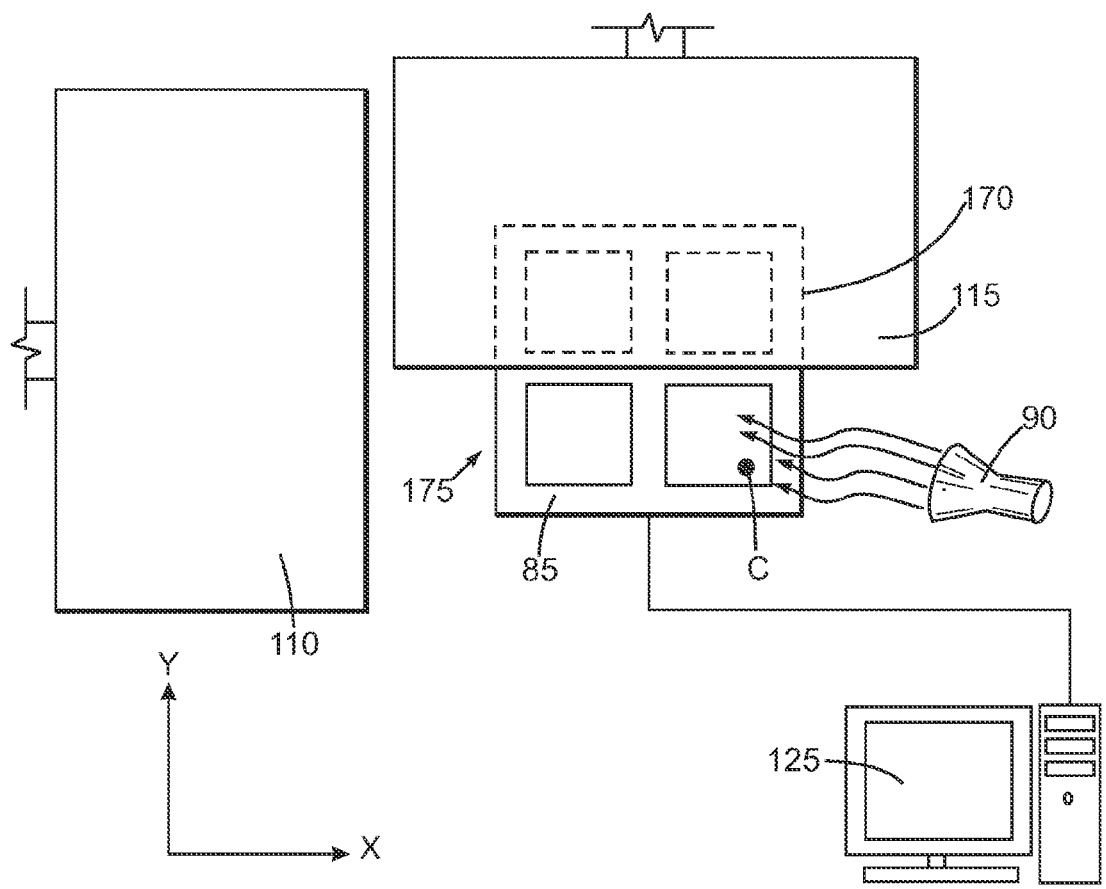
FIG. 6 is another overhead view showing a semiconductor chip and the exemplary embodiment of a defect scanning system.
Figure 7:
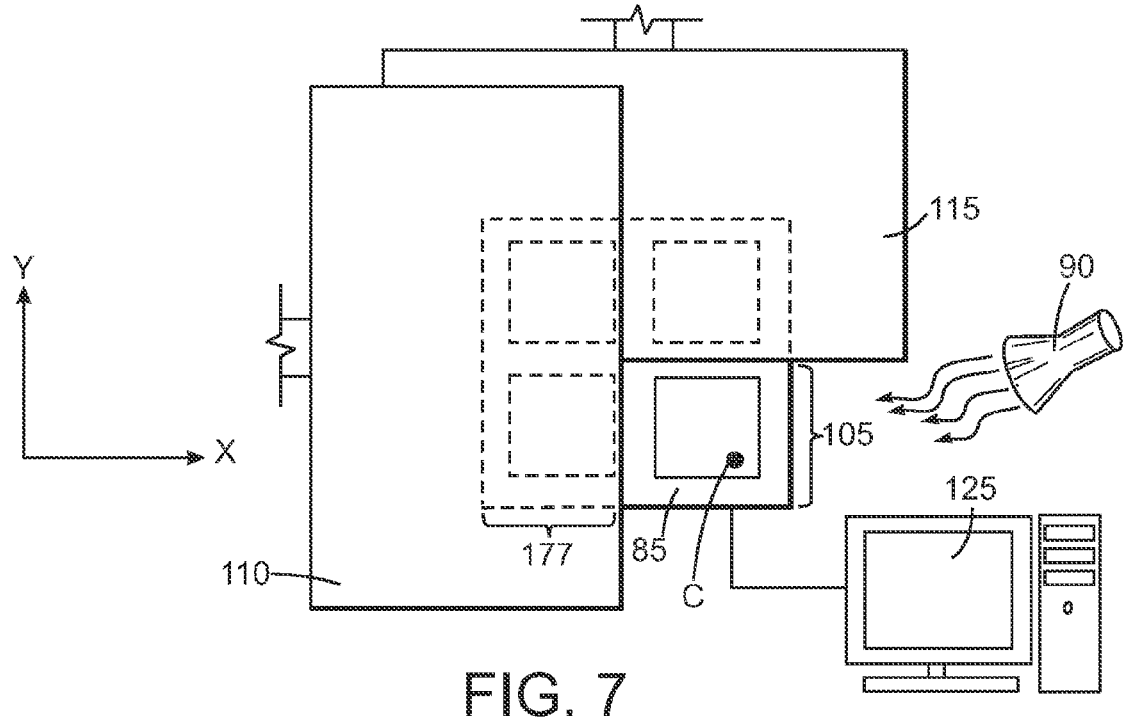
FIG. 7 is another overhead view showing a semiconductor chip and the exemplary embodiment of a defect scanning system.

The operation of the system 80 may be understood by referring now to FIGS. 6 and 7. FIG. 6 is an overhead view of the semiconductor chip 85, the two shutter plates 110 and 115 and the computer system 125. Note that the actuators 130 and 145 depicted in FIG. 5 are not shown for simplicity of illustration. Prior to testing the chip 85, deprocessing may be necessary to enable the infrared radiation to penetrate sufficiently into the surface of the chip 85. This may involve etches, lapping or the like. In order to track down the location of the soft defect C, a fractional portion 170 of the chip 85 is obscured by moving the shutter plate 115 over the chip 85 while the remaining fractional portion 175 of the chip 85 is left exposed. At this point, the lamp 90 may be activated and one or more test patterns may be run in the chip 85 by way of the computer system 125. If the soft defect C is located in the fractional portion 175 of the chip 85, then the test patterns will likely produce a measurable defect. The location of the soft defect C will thus be narrowed from somewhere in the entirety of the chip 85 to just the fractional portion 175 that was exposed during the initial test run. If no defect is present in the fractional portion 175, then the process may be reversed so that the fractional portion 175 is covered, the fractional portion 170 is exposed and another set of test patterns run concurrent with stimulation by the lamp 90. If a soft defect is located in the fractional portion 170 of the chip 85, then further localization may be performed. Assuming that the soft defect C is detected somewhere in the fractional portion 175, additional testing may be performed on just the fractional portion 175 to further localize the position of the soft defect C. In this regard, the shutter plate 110 may be moved along the X-axis over the chip 85 so that only the fractional portion 105 is exposed as shown in FIG. 7. At this point, the lamp 90 and computer system are again activated to apply one or more test patterns to the chip 85. If the soft defect C is located in the fractional portion 105 of the chip 85, the test patterns will register a computational anomaly and the location of the soft defect C will be pegged to the fractional portion 105 of the chip 85. If, however, no defect is apparent from the test patterns, then the fractional portion 105 of the chip 85 may be ruled out and testing activity turned to the remaining portion 177 of the chip 85 that has not undergone infrared perturbation.

Thus, the general technique involves applying an external stimulus to a series of fractional portions 170, 175 and 105 of the chip 85 where at least one of the fractional portions, namely the fractional portion 105, is smaller than one or more of the others 170 and 175. In this way, the testing proceeds from the large to the small. Even if only two fractional portions 170 and 175 are selected to cover one half each of the chip 85, one will be smaller than the other due to inherent errors in the positioning of the shutters 110 and 115. The difference may be quite small.

Once the position of the defect C is narrowed to a desirably sized region using the shutter system 100, a more precise location of the defect C may be attained by subjecting the chip 85 to laser scanning microscopy using, for example, the conventional system 10 depicted in FIG. 1. In this case, the pixel-by-pixel scanning associated with the conventional system 10 need not be used on the entirety of the chip 85, but rather some remarkably smaller portion thereof that has been localized using the new system 80 and techniques disclosed herein. A variety of infrared laser wavelengths may be used for the follow-on pixel-by-pixel test. For example, a 1.0 micron wavelength corresponds to the bandgap for electron hole pair formation in the silicon. If thermal excitation only is desired, a wavelength below the electron hole pair creating bandgap may be used, such as 1.32 microns.

Considerable flexibility in the sequence of tests is possible. For example, the chip 85 may be tested one half at a time, one third at a time, one quarter at a time and so on. Overall efficiency may be enhanced if initial testing focuses on large blocks of the chip 85 followed by smaller blocks as necessary.

Figure 8:
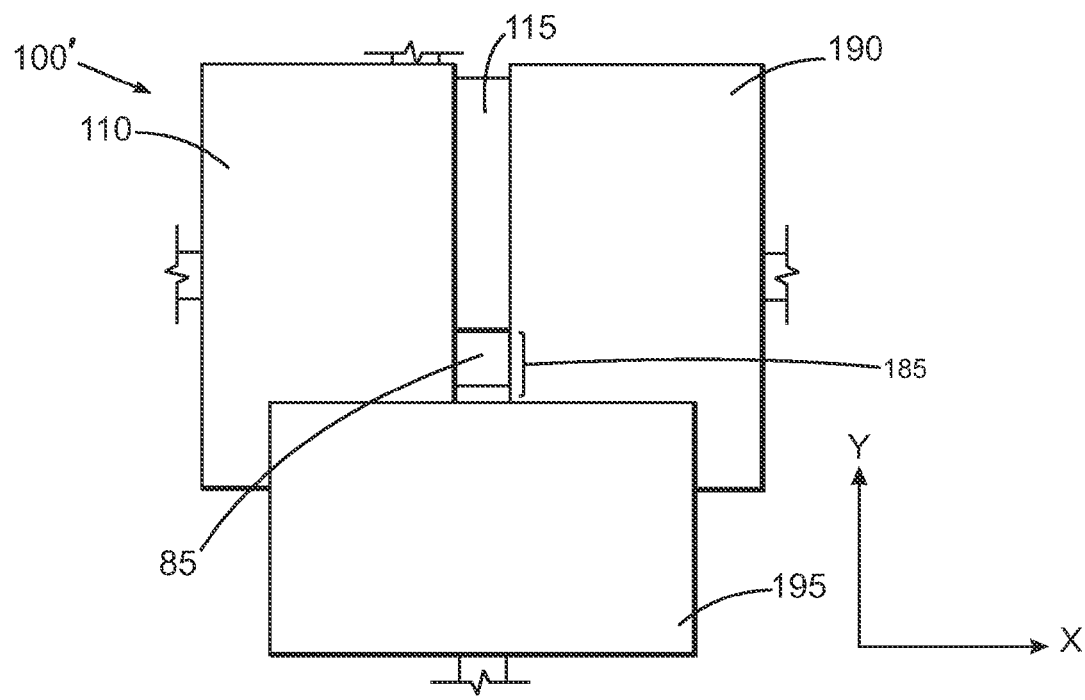
FIG. 8 is another overhead of another embodiment of an exemplary defect scanning system.

In the embodiment depicted in FIGS. 4-7, a shutter system 100 consisting of two two-axis shutter plates 110 and 115 may be used to selectively cover/expose portions of the chip 85. However, more than two shutter plates may be used. Attention is now turned to FIG. 8, which is an overhead view of a shutter system 100' positioned over the semiconductor chip 85 and activated so that only a small portion 185 of the chip 85 is exposed. In this case, the shutter system 100' may include the two shutter plates 110 and 115 as previously disclosed, and two additional shutter plates 190 and 195 that may be configured like the shutter plates 110 and 115. The shutter plates 110, 115, 190 and 195 may be capable of two-axis movement. However, with the use of four plates 110, 115, 190 and 195, each plate need only be capable of single-axis movement, that is, along either the X-axis or the Y-axis, in order to provide a selectively moveable opening through which radiation may be transmitted to the chip 85.

Figure 9:
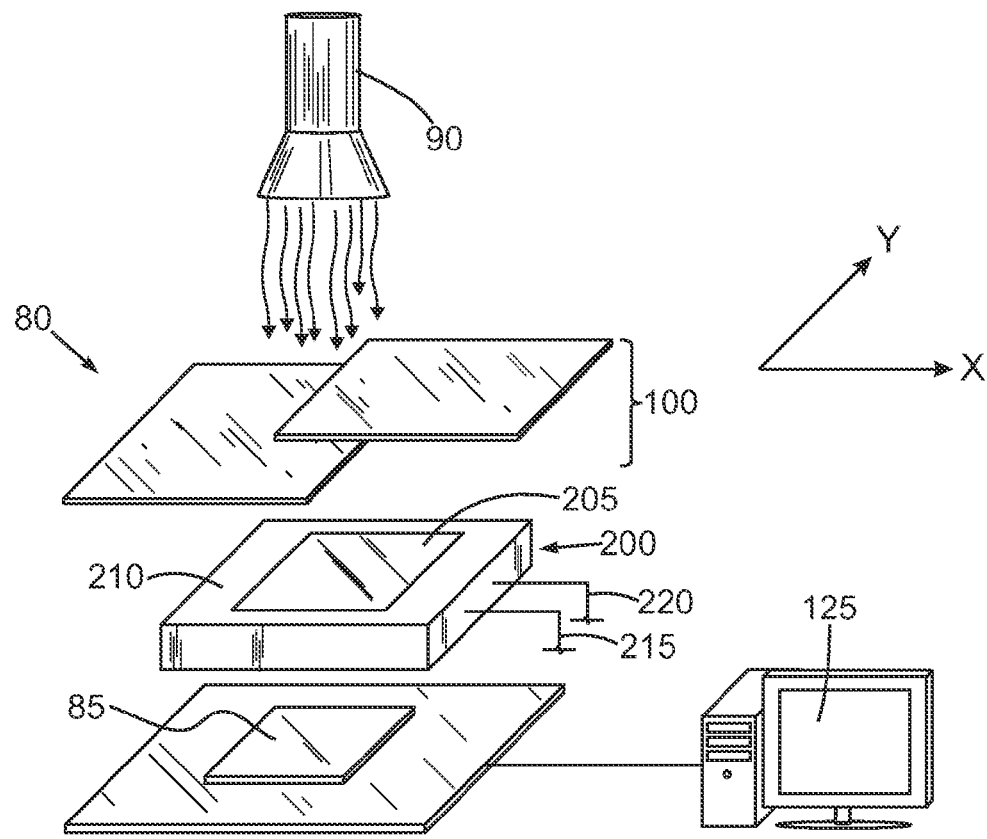
FIG. 9 is a partially exploded pictorial of another embodiment of a defect scanning system.

A given semiconductor chip may dissipate substantial quantities of thermal power. In such cases, it may be appropriate to provide a cooling solution for the chip that prevents thermal damage and/or shutdown while permitting the thermal perturbation testing described herein. In this regard, attention is now turned to FIG. 9, which is a partially exploded pictorial view of the system 80 that is again provided with a thermal lamp 90 and a shutter system 100 that are used to selectively illuminate portions of a packaged semiconductor chip 85. Electrical stimulation by way of test patterns is again provided by a computer system 125. However, in this illustrative embodiment, a cooling device or cold plate 200 may be positioned on the chip 85 beneath the shutter system 100. The cold plate 200 may be provided with an infrared transparent window 205 and a body 210. The body 210 may be formed of a thermally conductive material, such as copper, aluminum, nickel or the like, and cooled by fluid flow via coolant supply and return lines 215 and 220. Optionally, the lines 215 and 220 may be leads of a thermoelectric cooling system. Regardless of the configuration, the goal is to cool all portions of the chip 85 while certain portions are perturbed by the radiation from the lamp 90. The window 205 may be composed of, for example, diamond, sapphire or the like. The window 205 should have good transparency to infrared radiation and in the case of diamond, will have advantageous thermal conductivity so that the semiconductor chip 85 may be relieved of excess heat during the testing phase. Again, the shutter plates 110 and 115 of the shutter system 100 may be movable along the X and Y-axes or in the X-Y plane.

Figure 10:
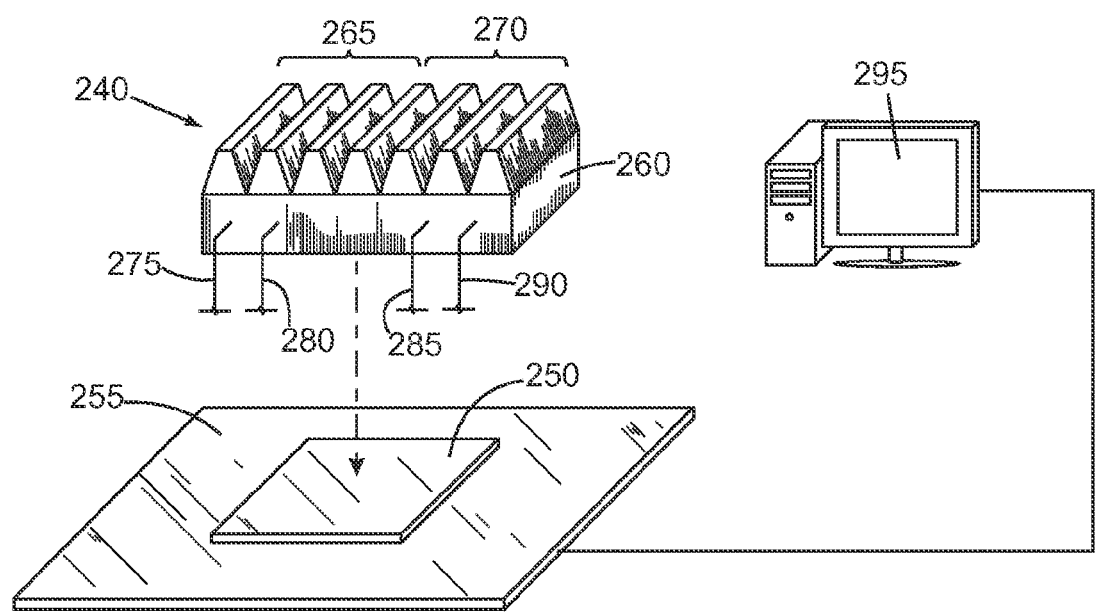
FIG. 10 is a partially exploded pictorial of another embodiment of a defect scanning system.

In the foregoing illustrative embodiments, an infrared lamp or infrared laser is used to provide the requisite perturbations to various portions of a semiconductor chip for purposes of locating a soft defect therein. However, another form of stimulation may be used in order to provide the requisite perturbation to various circuit structures. In this regard, FIG. 10 depicts an exemplary embodiment of a testing system 240, which is operable to selectively perturb portions of a semiconductor chip 250 that may be mounted on a package substrate 255 as shown. The system 240 may include a heat exchanger 260 that has two separate thermal zones 265 and 270 each of which may be heated or cooled to selective temperatures. In this regard, the zone 265 may include fluid supply or return lines 275 and 280 and the zone 270 may be provided with corresponding fluid supply and return lines 285 and 290. In this way, the heat exchanger 260 may be seated on the chip 250 and the temperature of the zone 265 may be raised to some elevated temperature. Then a computer system 295, which is electrically connected to the chip 250 may be operated to run one or more test patterns and to try to identify the location of any soft defects in the fractional portion of the chip that is seated beneath the zone 265. Subsequently, the zone 270 may be activated and raised to an elevated temperature and additional test patterns may be run from the computer system 295 to locate any defects that may be in the fractional portion of the chip 250 that is beneath the zone 270 of the heat exchanger 260. In this way, a soft defect may be localized to one half or another or some other fractional portion of the chip 250 quickly and thereafter that smaller portion of the chip 250 may be subjected to laser scanning microscopy as described elsewhere herein for a more precise localization of a soft defect.

Virtually any type of semiconductor chip may be tested using the techniques disclosed herein, such as microprocessors, graphics processors, combined microprocessor/graphics processors, memory devices, application specific integrated circuits or the like. Such devices may be multiple core and multiple dice. It should also be understood that the shutter systems 100 and 100' disclosed herein may be manually operated, that is, by hand input from an operator.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of testing a semiconductor chip having a surface and plural circuit structures positioned beneath the surface, comprising:
   applying an external stimulus to a series of fractional portions of the surface to perturb portions of the plural circuit structures, wherein at least one of the series of fractional portions is smaller than another of the series of fractional portions; and
   causing the semiconductor chip to perform a test pattern during the application of external stimulus to each of the fractional portions to determine if a soft defect exists in any of the series of fractional portions.

2. The method of claim 1, wherein the external stimulus comprises infrared radiation.

3. The method of claim 1, wherein the external stimulus comprises heat.

4. The method of claim 3, comprising applying heat with a heat exchanger operable to heat the series of fractional portions.

5. The method of claim 1, wherein the application of external stimulus comprises applying the external stimulus to each of the series of fractional portions while covering the others of the series of fractional portions.

6. The method of claim 5, comprising covering the others with a shutter system operable to selectively cover portions of the surface of the semiconductor chip.

7. The method of claim 1, comprising coupling a cooling device to the semiconductor chip during the application of external stimulus.

8. A method of testing a semiconductor chip, comprising:
   covering a first portion of the semiconductor chip while leaving a second portion exposed;
   applying an external stimulus to the second portion of the semiconductor chip; and
   causing the semiconductor chip to perform a test pattern during the application of the external stimulus to determine if a soft defect exists in the second portion of the semiconductor chip.

9. The method of claim 8, wherein the second portion comprises at least half the semiconductor chip.

10. The method of claim 8, wherein the covering the first portion comprises placing a shutter system over the semiconductor chip and activating the shutter system to cover the first portion of the semiconductor chip.

11. The method of claim 8, wherein the applying an external stimulus to the second portion comprises exposing the second portion with infrared radiation.

12. The method of claim 11, wherein the infrared radiation is supplied by an non-coherent source.

13. The method of claim 11, wherein the infrared radiation is supplied by a coherent source.

14. The method of claim 8, wherein the applying an external stimulus to the second portion comprises applying heat to the second portion.

15. The method of claim 8, comprising covering a third portion of the semiconductor chip while leaving a fourth portion exposed, stimulating the fourth portion of the semiconductor chip and causing the semiconductor chip to perform a test pattern during the stimulation of the fourth portion to determine if a soft defect exists in the fourth portion.

16. The method of claim 15, wherein the fourth portion is smaller than the second portion.

17. An apparatus for testing a semiconductor chip having a surface and plural circuit structures positioned beneath the surface, comprising:

a source of external stimulus operable to stimulate a series of fractional portions of the surface to perturb portions of the plural circuit structures, wherein at least one of the series of fractional portions is smaller than another of the series of fractional portions; and a computer system electrically coupled to the semiconductor chip to cause the semiconductor chip to perform a test pattern during the application of external stimulus to each of the fractional portions to determine if a soft defect exists in any of the series of fractional portions.

18. The apparatus of claim 17, wherein the source of external stimulus comprises an infrared radiation source.

19. The apparatus of claim 18, wherein the infrared source comprises a laser.

20. The apparatus of claim 17, wherein the source of external stimulus comprises a heat exchanger.

21. The apparatus of claim 17, comprising a shutter system operable to selectively expose a given fractional portion during stimulation of that given fractional portion while covering the others of the series of fractional portions.

22. The apparatus of claim 17, comprising a cooling device to cool the semiconductor chip during the application of external stimulus.

* * * * *